United States Patent [19]
Lee

[11] Patent Number: 6,087,246
[45] Date of Patent: Jul. 11, 2000

[54] METHOD FOR FABRICATING DUAL GATE SEMICONDUCTOR DEVICE

[75] Inventor: Kye-Nam Lee, Chungcheongbuk-do, Rep. of Korea

[73] Assignee: LG Semicon Co., Ltd., Chungcheongbuk-Do, Rep. of Korea

[21] Appl. No.: 09/012,243

[22] Filed: Jan. 23, 1998

[30] Foreign Application Priority Data

Apr. 21, 1997 [KR] Rep. of Korea ................ 97/14683

[51] Int. Cl.⁷ .................................. H01L 21/425
[52] U.S. Cl. ................... 438/517; 438/585; 438/199
[58] Field of Search ................. 438/585, 517, 438/199, 301, 621, 626

[56] References Cited

U.S. PATENT DOCUMENTS

| | | | |
|---|---|---|---|
| 4,826,943 | 5/1989 | Ito et al. | 528/21 |
| 4,891,303 | 1/1990 | Garza et al. | 430/312 |
| 4,912,065 | 3/1990 | Mizuno et al. | 438/301 |
| 5,169,494 | 12/1992 | Hashimoto et al. | 156/661.1 |
| 5,190,888 | 3/1993 | Schwalke et al. | 438/288 |
| 5,355,010 | 10/1994 | Fujii et al. | 257/377 |
| 5,468,669 | 11/1995 | Lee et al. | 437/51 |
| 5,550,079 | 8/1996 | Lin | 437/56 |
| 5,773,358 | 6/1998 | Wu et al. | 438/564 |
| 5,821,146 | 10/1998 | Chang et al. | 438/299 |
| 5,851,889 | 12/1998 | Michael et al. | 438/301 |
| 5,861,335 | 1/1999 | Hause et al. | 438/308 |
| 5,885,887 | 3/1999 | Hause et al. | 438/564 |

Primary Examiner—John F. Niebling
Assistant Examiner—John Murphy
Attorney, Agent, or Firm—Morgan, Lewis & Bockius LLP

[57] ABSTRACT

A method for fabricating a semiconductor device includes the steps of forming a gate insulating film on a substrate, forming semiconductor layer on the gate insulating film, selectively removing the semiconductor layer to form first and second gate electrodes, implanting ions of a first conductive type into the first gate electrode, and implanting impurity ions of a second conductive type into the second gate electrode.

37 Claims, 5 Drawing Sheets

METHOD FOR FABRICATING DUAL GATE SEMICONDUCTOR DEVICE

This application claims the benefit of Korean patent application No. 14683/1997, filed Apr. 21, 1997, which is hereby incorporated by reference.

BACKGROUND OF THE INVENTION

1. Field of the Invention

The present invention relates to a method for fabricating a semiconductor device, and more particularly, to a method for fabricating a semiconductor device suitable for forming dual gate electrodes with a multi layer resist process.

2. Discussion of the Related Art

As dimensions of integrated circuit devices are reduced, step coverage of a semiconductor device causes many limitations in forming patterns on a substrate. When a highly integrated semiconductor device has a step coverage in a photo etching process using only single layer resist with electron beam lithography, resistance against dry etch is reduced and resolution is lowered due to a scattering effect caused by reflection off a substrate. Accordingly, devices that could be manufactured using a single layer resist process in the past now require a photo etching process using a multi layer resist to achieve a desired resolution.

On the other hand, a multi layer resist process (MLR) has been developed using a bilayer resist or a triple layer resist. Such an MLR process is disclosed in U.S. Pat. Nos. 5,169,494, 4,826,943, and 4,891,303.

A conventional method for fabricating a semiconductor device will now be described with reference to FIGS. 1A to 1E showing cross-sectional views of process steps of the conventional method.

A gate insulating film 12 is formed on a surface of a semiconductor substrate 11, as shown in FIG. 1A, and a polysilicon layer 13 (for gate electrode formation) is formed over the gate insulating film 12. The polysilicon layer 13 is formed of a undoped amorphous polysilicon. A first photoresist film 14 is coated onto the polysilicon layer 13, and is patterned by an exposure and development process.

Next, with the first photoresist film 14 serving as a mask, n-type impurity ions are implanted into the polysilicon layer 13, as shown in FIG. 1B.

Thereafter, as shown in FIG. 1C, remaining portions of the first photoresist film 14 are removed. A second photoresist film 15 is coated onto the polysilicon layer 13, and is patterned with an exposure and development process. With the second photoresist film 15 serving as a mask, p-type impurity ions are implanted into the polysilicon layer 13.

As shown in FIG. 1D, what remains of the second photoresist film 15 is removed. The polysilicon layer 13 is annealed at a high temperature to activate and diffuse the n-type and p-type dopants. A third photoresist film 16 is coated onto the polysilicon layer 13, and is patterned using an exposure and development process.

Finally, as shown in FIG. 1E, with the third photoresist pattern 16 serving as a mask, the polysilicon layer 13 is selectively removed, forming a first gate electrode 17 with implanted n-type impurity ions, and a second gate electrode 18 with implanted p-type impurity ions. Since the polysilicon layer 13 has different etch rates in different regions, a portion of the polysilicon layer 13 where n-type impurity ions are implanted forms a first gate electrode 17 having a concave shape and a portion of the polysilicon layer 13 where p-type impurity ions are implanted forms a second gate electrode 18 having a convex shape. That is, the first and second gate electrodes 17 and 18 are formed having different shapes, which is not desirable. Thus, it is difficult to obtain the critical dimensions of the gate electrodes 17 and 18, and the characteristics of two devices are not uniform.

SUMMARY OF THE INVENTION

Accordingly, the present invention is directed to a method for fabricating a semiconductor device that substantially obviates one or more of the problems due to limitations and disadvantages of the related art.

An object of the invention is to provide a method for fabricating semiconductor devices having gates with identical shapes, making the characteristics of the devices uniform.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, in one aspect of the present invention there is provided a method for fabricating a semiconductor device, including the steps of forming a gate insulating film on a substrate, forming a semiconductor layer on the gate insulating film, selectively removing the semiconductor layer to form first and second gate electrodes, implanting ions of a first conductive type into the first gate electrode, and implanting ions of a second conductive type into the second gate electrode.

In another aspect of the present invention there is provided a method for fabricating a semiconductor device, including the steps of forming a gate insulating film on a substrate, forming a semiconductor layer on the gate insulating film, selectively etching the semiconductor layer to form first and second gate electrodes, forming a first resist film planarized to be approximately as high as top surfaces of the first and second gate electrodes, forming an insulating film on the substrate and the first resist film, forming a second resist film over the insulating film and the second gate electrode, implanting impurity ions of a first conductive type into the first gate electrode, removing the second resist film, forming a third resist film over the insulating film and the first gate electrode, implanting impurity ions of a second conductive type into the second gate electrode; removing the third resist film, the insulating film, and the first resist film, and annealing the semiconductor device.

In another aspect of the present invention there is provided a method of fabricating a dual gate semiconductor device, including the steps of forming a gate insulating layer on a substrate, forming a semiconductor layer over the gate insulating layer, forming a first masking layer over the semiconductor layer, patterning the first masking layer to form two masks, selectively removing portions of the semiconductor layer using the two masks to form a first gate and a second gate, removing the masks, forming a first resist layer over the gate insulating layer, the first gate and the second gate, planarizing the first resist layer, forming a second resist layer over the first gate, implanting ions of a first conductive type into the second gate, removing the second resist layer, forming a third resist layer over the second gate, implanting ions of a second conductivity type into the first gate, and removing the third resist layer and the first resist layer.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention that together with the description serve to explain the principles of the invention.

In the drawings:

FIGS. 1A to 1E are cross-sectional views showing process steps of a conventional method for fabricating a semiconductor device; and FIGS. 2A to 2G are cross-sectional views showing process steps of a method for fabricating a semiconductor device according to the present invention.

DETAILED DESCRIPTION OF THE PREFERRED EMBODIMENTS

Reference will now be made in detail to the preferred embodiments of the present invention, examples of which are illustrated in the accompanying drawings.

FIGS. 2A to 2G are cross-sectional views showing process steps of a method for fabricating a semiconductor device according to the present invention.

Figure 1A:
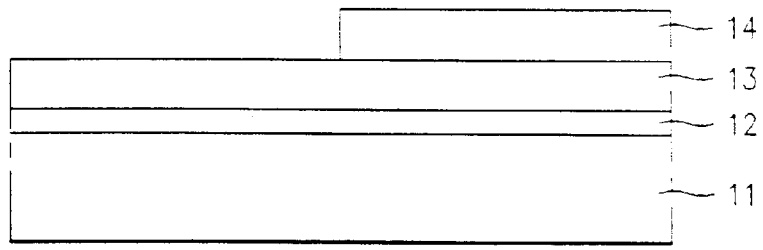
Figure 1B:
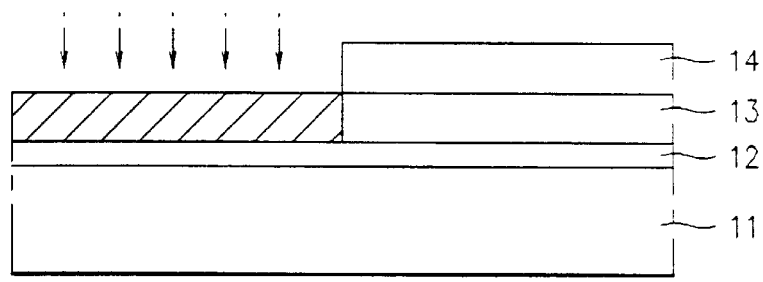
Figure 1C:
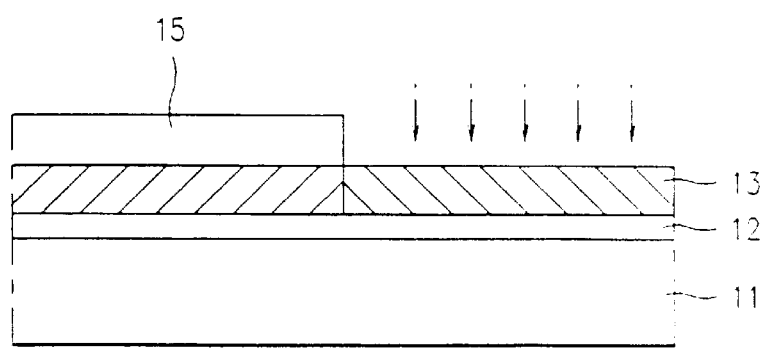
Figure 1D:
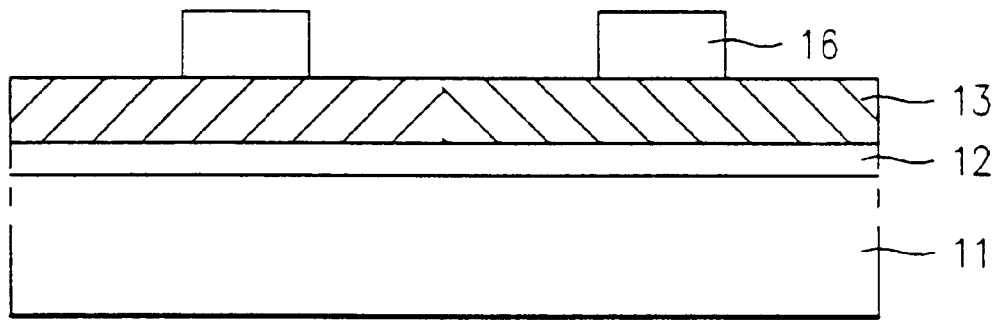
Figure 1E:
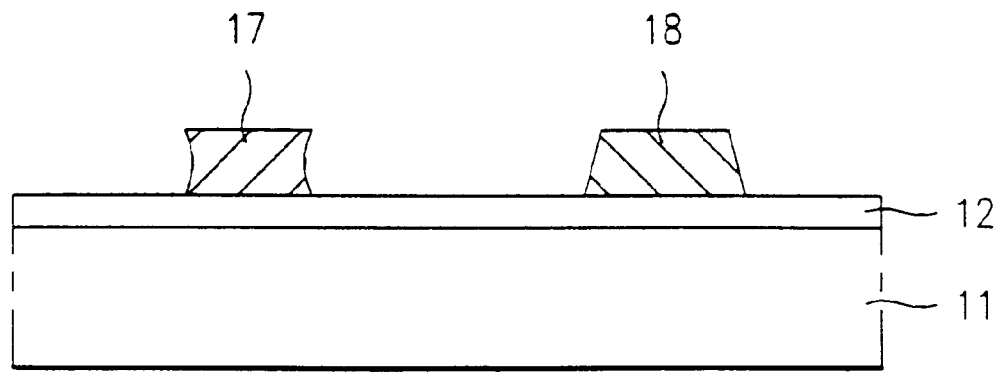
Figure 2A:
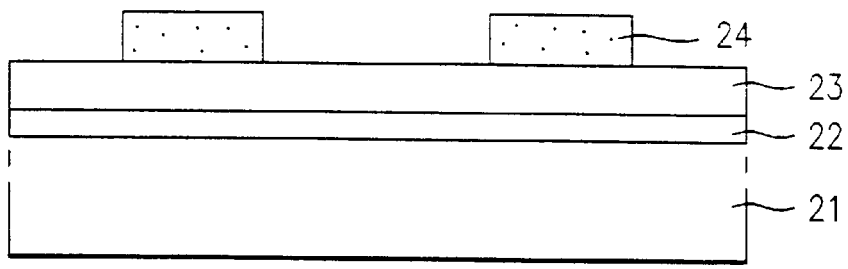

Referring to FIG. 2A, a gate insulating film 22 is formed on a semiconductor substrate 21, and an undoped polysilicon layer 23 is formed over the semiconductor substrate 21 and the gate insulating film 22. A photoresist film is coated onto the polysilicon layer 23, and is patterned with an exposure and development process to form a photoresist pattern 24.

Figure 2B:
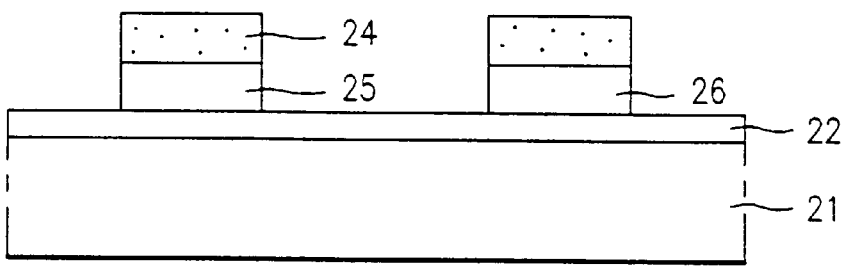

Referring to FIG. 2B, with the photoresist pattern 24 serving as a mask, the polysilicon layer 23 is selectively removed to form first and second gate electrodes 25 and 26 spaced apart from each other by a predetermined distance.

Figure 2C:
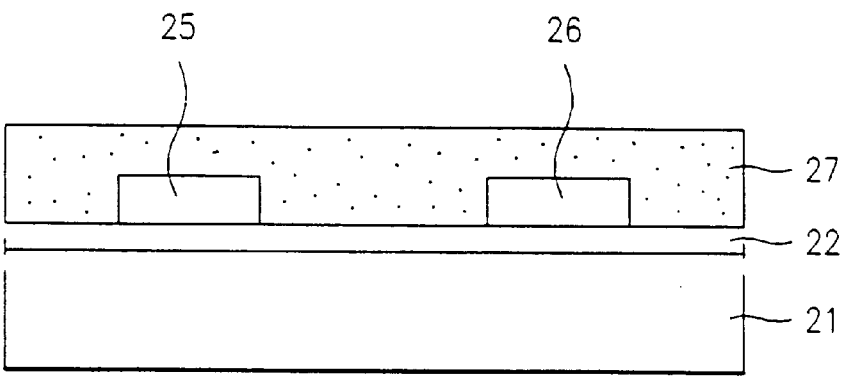

Referring to FIG. 2C, the photoresist pattern 24 is removed. A first resist film 27 is coated on the semiconductor substrate 21 including the first and second gate electrodes 25 and 26 and the gate insulating 22.

Figure 2D:
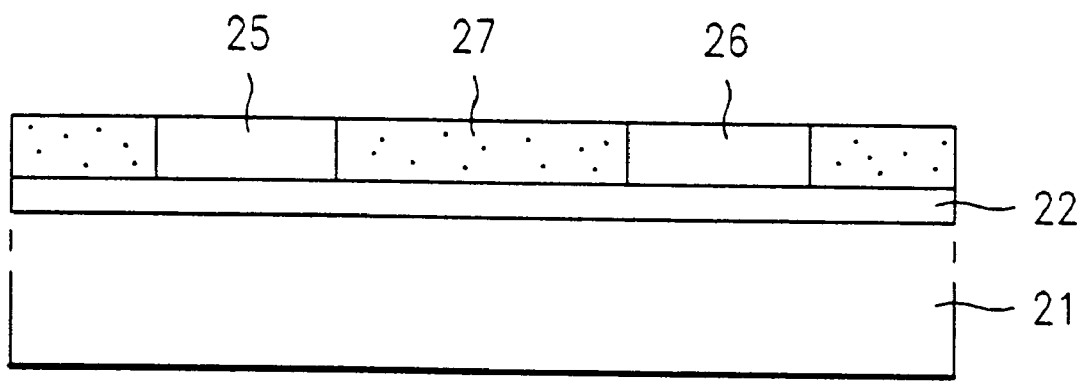

Referring to FIG. 2D, the first resist film 27 is planarized, so that it is as high as a top surface of the first and second gate electrodes 25 and 26. An etch back process or a chemical mechanical polishing (CMP) process may be used to planarize the first resist film 27.

An insulating film 28 is formed at a temperature of less than 250° C. on the entire surface of the semiconductor substrate 21 including the lower resist film 27. A second resist film 29 is then coated onto the insulating film 28.

Figure 2E:
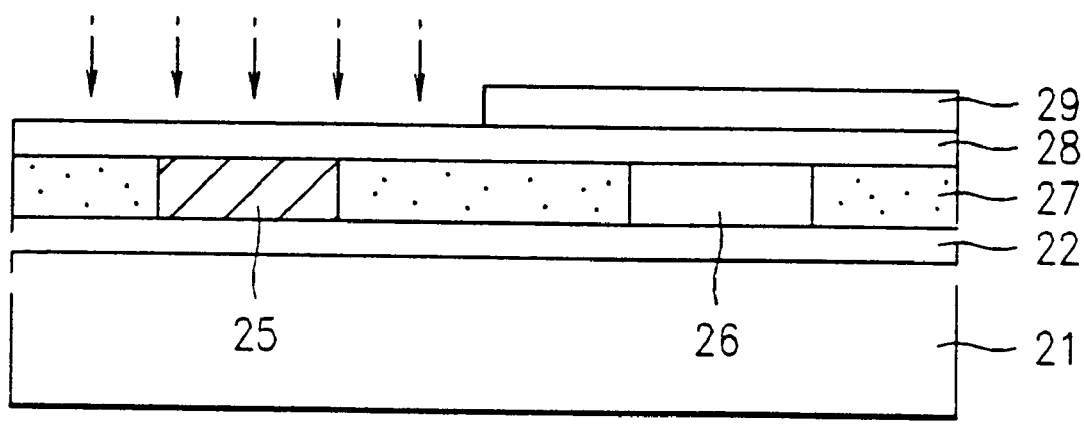

Referring to FIG. 2E, the second resist film 29 is patterned using an exposure and development process. With the second resist pattern 29 serving as a mask, n-type impurity ions are implanted into the first gate electrode 25. The n-type ion-implantation process has an energy of 5–100 Kev and a dose in the range of $10^{15}$–$10^{16}$.

Figure 2F:
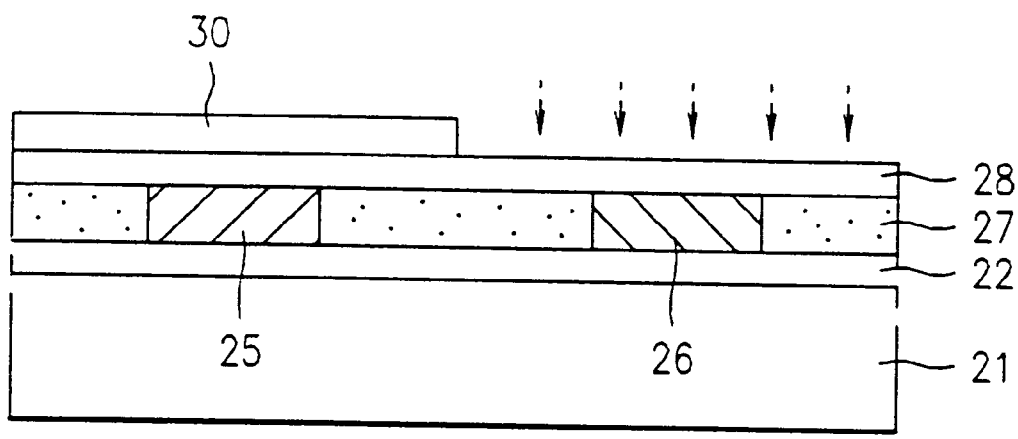

Referring to FIG. 2F, the second resist film 29 is removed and a third resist film 30 is coated onto the semiconductor substrate 21 and the insulating film 28, and is patterned with an exposure and development process. With the third resist pattern 30 serving as a mask, p-type impurity ions are implanted into the second gate electrode 26. The p-type ion-implantation process has an energy of 5–100 Kev and a dose in the range of $10^{15}$–$10^{16}$.

Figure 2G:
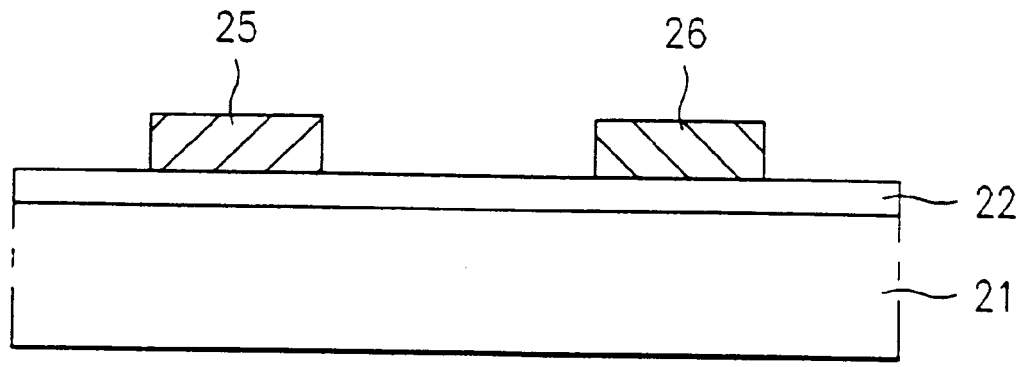

Referring to FIG. 2G, the third resist film 30 is removed, and the insulating film 28 is removed with a wet etch process. Next, the first film 27 is removed. An annealing process is performed at a high temperature to activate and diffuse n-type and p-type dopants implanted into the first and second gate electrodes 25 and 26, respectively.

The method for fabricating a semiconductor device according to the present invention has the following advantage. Since an intrinsic semiconductor layer is formed and patterned to form two gate electrodes having identical shapes, the characteristics of two devices having a minimum line width can be uniform.

While the invention has been described in detail and with reference to specific embodiments thereof, it will be apparent to those skilled in the art that various modification and variations can be made in the method for fabricating a semiconductor device of present invention without departing from the spirit or scope of the inventions. Thus, it is intended that the present invention cover the modifications and variations of this invention provided they come within the scope of the appended claims and their equivalents.

What is claimed is:

1. A method for fabricating a semiconductor device, the method comprising the steps of:

forming a gate insulating film on a substrate;

forming a semiconductor layer on the gate insulating film;

selectively removing the semiconductor layer to form first and second gate electrodes;

forming a first resist layer covering portions of the substrate other than the first and second gate electrodes, the first resist layer having substantially the same height as the first and second gate electrodes;

forming an insulation layer on the first resist layer and the first and second gate electrodes;

implanting ions of a first conductivity type into the first gate electrode; and implanting ions of a second conductivity type into the second gate electrode.

2. The method of claim 1, wherein the ions of the first and second conductivity types have an implant energy of 5–100 Kev and a dose of $10^{15}$–$10^{16}$.

3. The method of claim 1, wherein the semiconductor layer includes polysilicon.

4. The method of claim 1, wherein the first and second conductivity types are n-type and p-type, respectively.

5. A method for fabricating a semiconductor device, comprising the steps of:

forming a gate insulating film on a substrate;

forming a semiconductor layer on the gate insulating film;

selectively etching the semiconductor layer to form first and second gate electrodes;

forming a first resist film planarized to be approximately as high as top surfaces of the first and second gate electrodes;

forming an insulating film on the substrate and the first resist film;

forming a second resist film over the insulating film and the second gate electrode;

implanting impurity ions of a first conductive type into the first gate electrode;

removing the second resist film;

forming a third resist film over the insulating film and the first gate electrode;

implanting impurity ions of a second conductive type into the second gate electrode;

removing the third resist film, the insulating film, and the first resist film; and annealing the semiconductor device.

6. The method of claim 5, the step of forming a first resist film planarized to be approximately as high as top surfaces of the first and second gate electrodes includes a step of one of an etch back or a chemical mechanical polishing process.

7. The method of claim 5, wherein the step of forming an insulating film is performed at a temperature lower than 250° C.

8. The method of claim 5, wherein the step of forming a semiconductor layer includes the step of forming a polysilicon layer.

9. The method of claim 5, wherein the steps of implanting impurity ions of a first conductive type and implanting impurity ions of a second conductive type are performed with an energy of 5–100 Kev and a dose of $10^{15}$–$10^{16}$.

10. The method of claim 5, wherein the steps of implanting impurity ions of a first conductive type and implanting impurity ions of a second conductive type are performed with n-type and p-type ions, respectively.

11. The method of claim 5, wherein the steps of removing the third resist film, the insulating film, and the first resist film insulating film include removing the films with a wet-etch process.

12. A method of fabricating a dual gate semiconductor device, comprising the steps of:

forming a gate insulating layer on a substrate;

forming a semiconductor layer over the gate insulating layer;

forming a first masking layer over the semiconductor layer;

patterning the first masking layer to form two masks;

selectively removing portions of the semiconductor layer using the two masks to form a first gate and a second gate;

removing the masks;

forming a first resist layer over the gate insulating layer, the first gate and the second gate;

planarizing the first resist layer;

forming a second resist layer over the first gate;

implanting ions of a first conductive type into the second gate;

removing the second resist layer;

forming a third resist layer over the second gate;

implanting ions of a second conductivity type into the first gate; and removing the third resist layer and the first resist layer.

13. The method of claim 12, further including a step of forming an insulation layer over the semiconductor layer and the first resist layer after the step of planarizing the first resist layer.

14. The method of claim 13, wherein the steps of removing the third resist layer and the first resist layer include removing the insulation layer.

15. The method of claim 14, wherein the step of removing the insulation layer includes a step of wet-etching the insulation layer.

16. The method of claim 12, further including the step of annealing the first and second gates.

17. The method of claim 12, wherein the steps of implanting ions of a first conductivity type into the second gate and implanting ions of a second conductivity type into the first gate include the steps of implanting ions having an implant energy of 5–100 Kev and a dose of $10^{15}$–$10^{16}$.

18. The method of claim 12, wherein the steps of implanting ions of a first conductivity type into the second gate and implanting ions of a second conductivity type into the first gate include the steps of implanting ions of n-type and p-type, respectively.

19. The method of claim 12, wherein the step of forming a semiconductor layer includes the step of forming a polysilicon layer.

20. The method of claim 1, further including the step of forming a second resist layer on the insulation layer.

21. The method of claim 20, further including the step of selectively removing the second resist layer over the second gate electrode prior to the step of implanting ions of the first conductivity type.

22. The method of claim 21, further including the step of removing the second resist layer.

23. The method of claim 22, further including the step of forming a third resist layer on the insulation layer.

24. The method of claim 23, further including the step of selectively removing the third resist layer over the first gate electrode prior to the step of implanting ions of the second conductivity type.

25. The method of claim 24, further including the step of removing the third resist layer.

26. The method of claim 25, further including the step of removing the first resist layer and the insulation layer.

27. The method of claim 26, wherein the third resist layer, the insulation layer, and the first resist layer are removed with a wet-etch process.

28. The method of claim 26, wherein the insulation layer is removed by wet-etching.

29. The method of claim 1, wherein the insulation layer is formed directly on the first resist layer and the first and second gate electrodes.

30. The method of claim 1, wherein the step of forming the insulating layer is performed at a temperature lower than 250° C.

31. The method of claim 2, wherein the ions of the first and second conductivity types have an implant energy of 16–100 KeV.

32. The method of claim 2, wherein the ions of the first and second conductivity types have an implant energy of 5–14 KeV.

33. The method of claim 2, wherein the ions of the first and second conductivity types have a dose between $5.1 \times 10^{15}$ and $10^{16}$.

34. The method of claim 2, wherein the ions of the first and second conductivity types have a dose between $10^{15}$ and $4.9 \times 10^{15}$.

35. The method of claim 1, wherein the first resist layer is planarized using an etch-back process to have the same height as the first and second gate electrodes.

36. The method of claim 1, wherein the first resist layer is planarized using chemical mechanical polishing to have substantially the same height as the first and second gate electrodes.

37. The method of claim 1, further including the step of annealing the first and second gate electrodes.

* * * * *